(12) United States Patent
Santos et al.

(10) Patent No.: US 10,347,554 B2
(45) Date of Patent: Jul. 9, 2019

(54) SPATIALLY SELECTIVE ROUGHENING OF ENCAPSULANT TO PROMOTE ADHESION WITH FUNCTIONAL STRUCTURE

(71) Applicant: Infineon Technologies AG, Neubiberg (DE)

(72) Inventors: Norbert Joson Santos, Baguio (PH); Edward Fuergut, Dasing (DE); Sanjay Kumar Murugan, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/462,858

(22) Filed: Mar. 19, 2017

(65) Prior Publication Data

US 2017/0271229 A1    Sep. 21, 2017

(30) Foreign Application Priority Data

Mar. 21, 2016  (DE) .................. 10 2016 105 243

(51) Int. Cl.
*H01L 23/31*    (2006.01)
*H01L 23/00*    (2006.01)
(Continued)

(52) U.S. Cl.
CPC ...... *H01L 23/3114* (2013.01); *H01L 21/0206* (2013.01); *H01L 21/31058* (2013.01);
(Continued)

(58) Field of Classification Search
CPC ... H01L 2924/1461; H01L 2924/12041; H01L 23/49541; H01L 23/3114; H01L 23/3675; H01L 23/486; H01L 33/642; H01L 23/49568; H01L 21/565; H01L 23/3142; H01L 23/3135; H01L 243/24; H01L 23/4006; H01L 23/3107; H01L 2023/405; H01L 2023/4081; H01L 2023/4087; H01L 2924/00012; H01L 2924/00014; H01L 33/58; H01L 2924/1811;
(Continued)

(56) References Cited

U.S. PATENT DOCUMENTS 5,236,636 A    8/1993  Tisack
6,869,831 B2   3/2005  Cowens et al.
(Continued)

FOREIGN PATENT DOCUMENTS

| CN | 103515332 A | 1/2014 |
| JP | 2003158234 A | 5/2003 |
| JP | 2013023666 A | 2/2013 |

OTHER PUBLICATIONS

How Plasma-Enhanced Surface Modification Improves the Production of Microelectronics and Optoelectronics; Author: Dr. James D. Getty; Publication: 2002.
(Continued)

*Primary Examiner* — Jasmine J Clark

(57) ABSTRACT

An electronic component which comprises an electrically conductive carrier, an electronic chip on the carrier, an encapsulant encapsulating at least part of at least one of the carrier and the electronic chip, and a functional structure covering a surface portion of the encapsulant, wherein at least part of the covered surface portion of the encapsulant is spatially selectively roughened.

20 Claims, 7 Drawing Sheets

(51) Int. Cl.

| | |
|---|---|
| *H01L 23/40* | (2006.01) |
| *H01L 23/367* | (2006.01) |
| *H01L 23/495* | (2006.01) |
| *H01L 21/56* | (2006.01) |
| *H01L 21/02* | (2006.01) |
| *H01L 21/67* | (2006.01) |
| *H01L 33/48* | (2010.01) |
| *H01L 33/54* | (2010.01) |
| *H01L 33/62* | (2010.01) |
| *H01L 33/64* | (2010.01) |
| *H01L 21/3105* | (2006.01) |
| *H01L 33/58* | (2010.01) |
| *H01L 33/60* | (2010.01) |
| *H01L 43/02* | (2006.01) |
| *H01L 23/24* | (2006.01) |

(52) U.S. Cl.
CPC ...... *H01L 21/565* (2013.01); *H01L 21/67126* (2013.01); *H01L 23/3135* (2013.01); *H01L 23/3142* (2013.01); *H01L 23/3675* (2013.01); *H01L 23/4006* (2013.01); *H01L 23/49541* (2013.01); *H01L 24/32* (2013.01); *H01L 24/83* (2013.01); *H01L 33/486* (2013.01); *H01L 33/54* (2013.01); *H01L 33/58* (2013.01); *H01L 33/60* (2013.01); *H01L 33/62* (2013.01); *H01L 33/642* (2013.01); *H01L 43/02* (2013.01); *H01L 23/24* (2013.01); *H01L 23/3107* (2013.01); *H01L 2023/405* (2013.01); *H01L 2023/4081* (2013.01); *H01L 2023/4087* (2013.01); *H01L 2224/2919* (2013.01); *H01L 2224/32013* (2013.01); *H01L 2224/32245* (2013.01); *H01L 2224/48091* (2013.01); *H01L 2224/48247* (2013.01); *H01L 2224/73265* (2013.01); *H01L 2924/00014* (2013.01); *H01L 2924/12041* (2013.01); *H01L 2924/1461* (2013.01); *H01L 2924/181* (2013.01); *H01L 2924/1815* (2013.01); *H01L 2933/005* (2013.01); *H01L 2933/0066* (2013.01); *H01L 2933/0075* (2013.01)

(58) Field of Classification Search
CPC . H01L 2224/73265; H01L 2224/48247; H01L 33/60; H01L 2224/48091; H01L 2224/32245; H01L 2224/32013; H01L 33/62; H01L 2224/2919; H01L 21/0206; H01L 2933/0066; H01L 33/54; H01L 21/31058; H01L 21/67126; H01L 2933/0075; H01L 2933/005
See application file for complete search history.

(56) References Cited

U.S. PATENT DOCUMENTS

| | | | |
|---|---|---|---|
| 8,945,983 | B2 | 2/2015 | Liu et al. |
| 9,184,349 | B2* | 11/2015 | Jeong ............... H01L 24/97 |
| 2004/0058476 | A1 | 3/2004 | Enquist et al. |
| 2004/0140539 | A1 | 7/2004 | Abbott |
| 2008/0001264 | A1 | 1/2008 | Lange |
| 2008/0012036 | A1* | 1/2008 | Loh ............... H01L 33/483 257/99 |
| 2008/0061451 | A1 | 3/2008 | Huang et al. |
| 2008/0170372 | A1 | 7/2008 | Kirigaya |
| 2009/0050925 | A1* | 2/2009 | Kuramoto ........... H01L 33/486 257/100 |
| 2010/0224983 | A1* | 9/2010 | Huang ............... H01L 21/568 257/692 |
| 2012/0168943 | A1 | 7/2012 | Gan et al. |
| 2012/0280116 | A1 | 11/2012 | Krauter et al. |
| 2013/0292848 | A1* | 11/2013 | Na ............... H01L 23/5226 257/774 |
| 2014/0124820 | A1 | 5/2014 | Jeong et al. |
| 2014/0197552 | A1 | 7/2014 | Otremba et al. |
| 2014/0307390 | A1 | 10/2014 | Baker et al. |
| 2015/0008583 | A1 | 1/2015 | Gerber |

OTHER PUBLICATIONS

Mold Compound Adhesion to Bare Copper Lead Frames—Effect of Laser Texturing; Author: Joseph Fauty; Publication: 2002.
Design Guide for Bonding Plastics; Author: Henkel Corporation; Publication: 2011.
Chemical Interaction, Adhesion and Diffusion Properties at the Interface of Cu and Plasma-Treated Thiophene-Based Plasma Polymer (Thiopp) Films; Author: K.J. Kim; Publication: 2001.

* cited by examiner

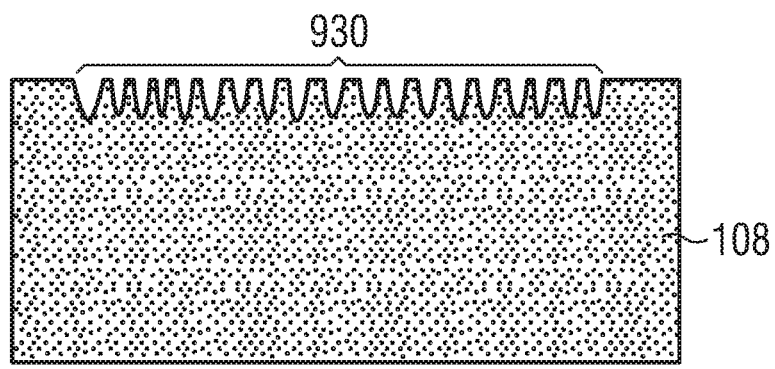
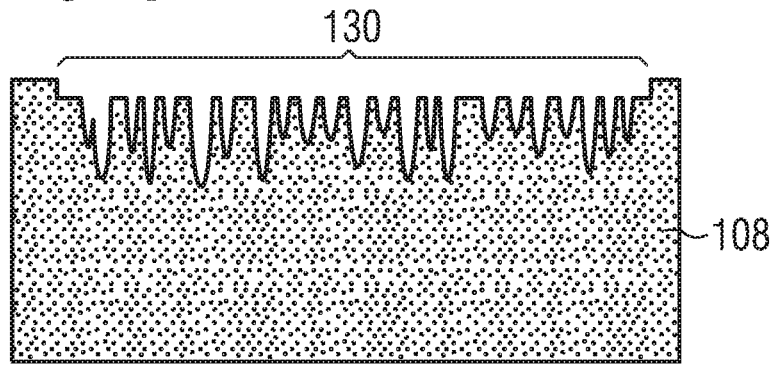
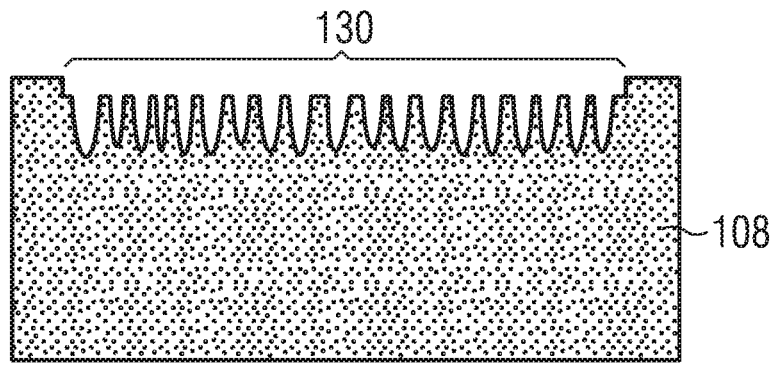

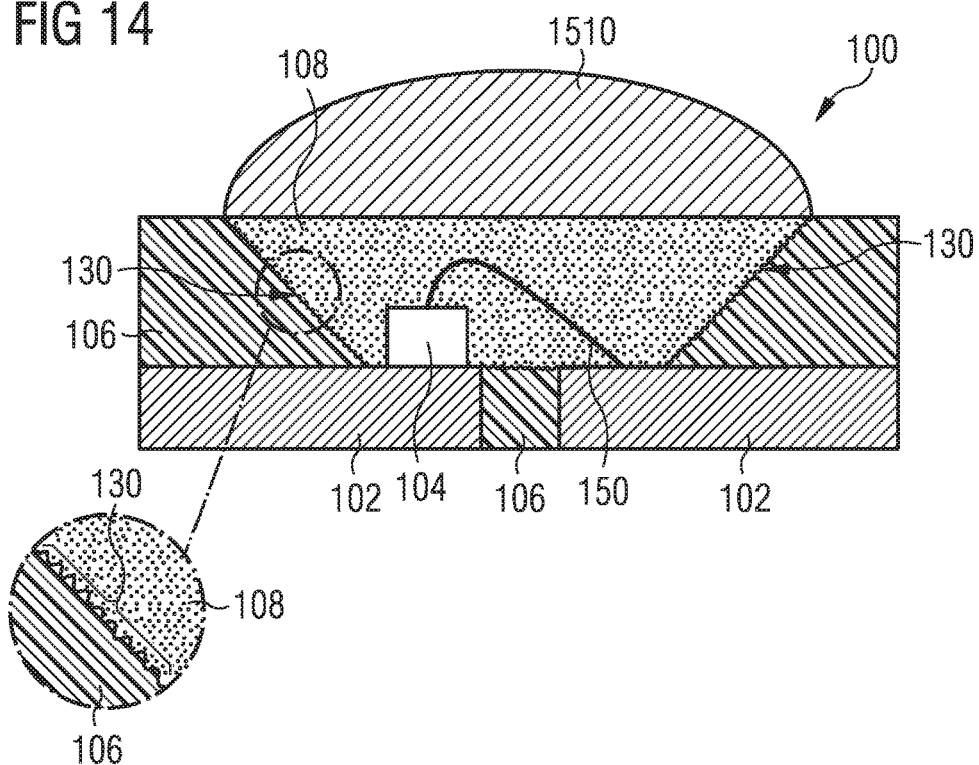
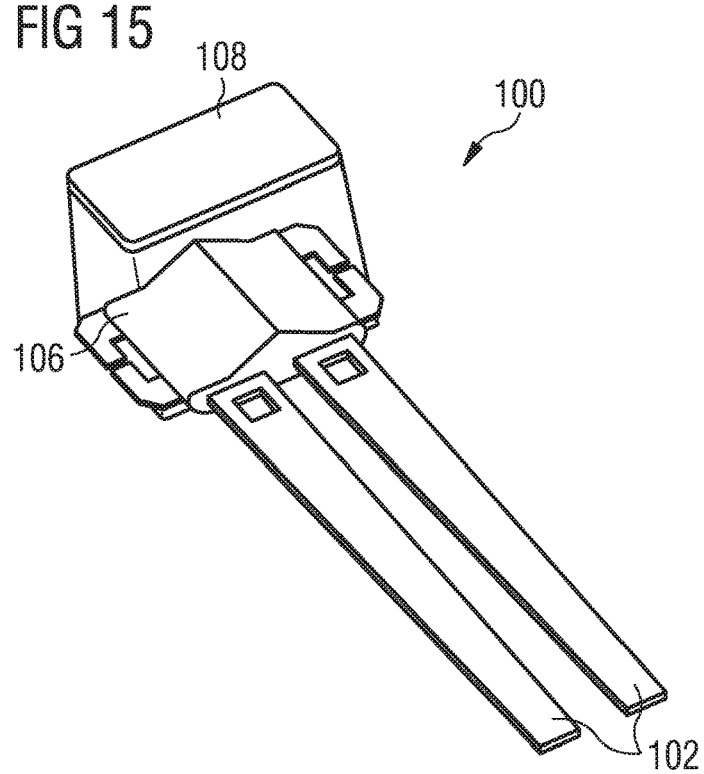

SPATIALLY SELECTIVE ROUGHENING OF ENCAPSULANT TO PROMOTE ADHESION WITH FUNCTIONAL STRUCTURE

BACKGROUND

Technical Field

Various embodiments relate generally to electronic components, to an apparatus for manufacturing a component with an encapsulant, and to methods of manufacturing an electronic component.

Description of the Related Art

Conventional packages, such as mold structures, for electronic chips have evolved to a level where the package no longer significantly impedes the performance of the electronic chips. Such electronic chips can be mounted on a leadframe, and an opposing main surface of the electronic chips may be connected to the leadframe by a bond wire. Such a conventional electronic chip may suffer from its thermal insulation within the package.

For certain applications, packages are formed with two different encapsulants for providing two different properties (such as compressibility, softness, robustness, mechanical decoupling, magnetic properties, color, etc.). Ensuring reliable connection between the different encapsulants may be a challenge.

Hence, there is still room for improving electronic components in terms of reliability.

SUMMARY

There may be a need to provide a possibility to manufacture electronic devices with a simple processing architecture and with a high reliability.

According to an exemplary embodiment, an electronic component (such as a semiconductor package) is provided which comprises an electrically conductive carrier (for instance a leadframe), an electronic chip (such as a semiconductor chip) on the carrier, an encapsulant (such as a mold compound) encapsulating at least part of at least one of the carrier and the electronic chip, and a functional structure (for instance comprising a functionalization in terms of thermal conductivity, electric isolation, optical transmissivity, magnetic properties, stress decoupling, coloring, etc.) covering a surface portion of the encapsulant, wherein at least part of the covered surface portion of the encapsulant is spatially selectively roughened.

According to another exemplary embodiment, a method of manufacturing an electronic component is provided, wherein the method comprising mounting an electronic chip on an electrically conductive carrier, encapsulating at least part of at least one of the carrier and the electronic chip by an encapsulant, spatially selectively roughening a surface portion of the encapsulant to thereby form a spatially selectively roughened surface, and covering at least part of the roughened surface of the encapsulant by a functional structure.

According to still another exemplary embodiment, an electronic component is provided which comprises an electronic chip, an encapsulant (for example a mold compound), and a functional structure (for example a further mold compound, a thermal interface material, a foil, a print material) covering a surface portion of the encapsulant, wherein at least part of the covered surface portion of the encapsulant is selectively roughened, and wherein the electronic chip is at least partially encapsulated by at least one of the encapsulant and the functional structure.

According to yet another exemplary embodiment, a method of manufacturing a component (in particular an electronic component) is provided, wherein the method comprises forming an encapsulant (in particular a mold compound), and covering a surface portion of the encapsulant by a functional structure (in particular a thermal interface material), wherein only or exclusively a sub-portion of the covered surface portion of the encapsulant is selectively and locally roughened (wherein optionally an electronic chip is at least partially encapsulated by at least one of the encapsulant and the functional structure).

According to another exemplary embodiment of the invention, an apparatus for manufacturing an electronic component with an encapsulant having a spatially selectively roughened surface is provided, wherein the apparatus comprises an encapsulation tool having an accommodation space configured for forming an encapsulant, wherein the encapsulation tool has an, in relation to the roughened surface of the encapsulant to be formed, inverse roughened surface delimiting part of the accommodation space so that, when a preform (for instance in viscous, liquid or granular form) of the encapsulant is filled in the accommodation space and is solidified (or cured), the encapsulant is formed with the roughened surface in a region corresponding to the inverse roughened surface.

An exemplary embodiment has the advantage that a reliability of the mechanical coupling between an encapsulant and a functional structure formed thereon can be significantly improved by roughening at least a part of a connection surface of the encapsulant to which the functional structure shall be connected in a delamination protected way. Roughening a connection surface of the encapsulant increases the mutual connection surface area and also provides additional grip so that a clawing effect between encapsulant and functional structure may further suppress the tendency of delamination under stress. This allows to increase the reliability of the electronic component as a whole. Thus, it can be ensured that the function provided by the functional structure in the framework of the functionality of the electronic component can be reliably maintained for a long term without the risk of loss of adhesion between encapsulant and functional structure. Adhesion is important for obtaining a sufficiently reliable maintenance of the device function over the life time of the electronic component (for instance, adhesion is important to ensure a sufficient electrical isolation over the life time of the package). Locally higher roughness may also increase a length of an isolation path.

DESCRIPTION OF FURTHER EXEMPLARY EMBODIMENTS

In the following, further exemplary embodiments of the electronic components, the apparatus, and the methods will be explained.

In the context of the present application, the term "roughness" or "surface roughness" may particularly denote a parameter indicative of or quantifying structural deviations in a direction of the normal vector of a real surface from its ideal flat or planar form. If these deviations are larger, the surface is rougher, if they are smaller, the surface is smoother. If these deviations are specifically enlarged by a certain treatment, the surface is roughened. "Roughness" of a surface may be defined as and may be measured as the centerline average height (Ra) being the arithmetic mean value of all distances of the profile from the centerline (for instance, the measurement may be carried out according to DIN 4768). A roughness of the roughened surface versus a surrounding non-roughened surface may be compared based on the centerline average height (Ra). On a microscopic scale, a roughened surface may have micro-protrusions spaced by micro-indentations. The mentioned protrusions may have a convex shape, a concave shape, or a mixture thereof, depending on the roughening procedure for creating the roughened surface.

In an embodiment, the roughened surface of the encapsulant has a uniform or even roughness profile. A uniform and sufficiently pronounced roughness profile (for instance as shown in FIG. 11) has the advantage of a significant and homogeneous improvement of the adhesion reliability between encapsulant and structure.

In an embodiment, the roughened surface of the encapsulant has a roughness (Ra) of at least 1 µm, in particular in a range between 1 µm and 10 µm, more particularly in a range between 2 µm and 4 µm. The selection of these parameters is the result of a trade-off between adhesion reliability on the one hand and releaseability on the other hand. After having molded the electronic component (for example, by transfer molding or compression molding), it is necessary to remove the manufactured electronic component from a mold tool. An excessive roughness renders such a removal (without additional effort) difficult. Especially on the side edges, high roughness may cause problems, as well as on positions on which two mold tools abut to one another. At such positions, it is technical preferred to prevent excessive roughness. Also, the chip carrier (die pad, heat sink, etc.) shall remain preferably free of encapsulant material (mold flash), which can be obtained by a small roughness at such positions. However, in order to obtain a proper reliability of the electronic components in terms of a reliable adhesion of the functional structure and the encapsulant, a sufficiently pronounced roughness is desired. The roughness of the roughened surface may be significantly larger than a natural or inherent certain degree of roughness of an encapsulant resulting from an ordinary manufacturing procedure such as molding. However, the skilled person will understand that such a natural or unspecific roughness, which may be in a range between 0.4 µm and 0.8 µm when applying molding (such as compression molding or transfer molding), is not to be considered as a roughened surface, since the latter term implies a defined roughening procedure. In other words, a roughened surface may be formed by executing a roughening procedure exerted to a surface portion of the encapsulant to be roughened.

In an embodiment, the electronic component comprises a discontinuity which is formed in the surface portion of the encapsulant covered by the functional structure. For example, such a discontinuity may be one or more recesses and/or one or more indentations. However, a discontinuity may also be formed by a step. The discontinuity may be arranged as an annular structure extending along the encapsulant, in particular extending around an entire exposed surface of a carrier. It is however also possible that the discontinuity extends in a circumferential direction only partially around the carrier. Multiple separate discontinuities may be formed around the carrier, for instance unconnected portions of a circular line or multiple annular structures around the carrier. While the roughened surface may provide a large number of (in particular ordered or random) micro-indentations, the discontinuity may form a single or a small number of macroscopic indentations. In other words, dimensions of one or more substructures of a discontinuity in a surface plane of the encapsulant and perpendicular to this surface plane may be significantly larger than (in particular at least three times of, more particularly at least 10 times of) corresponding dimensions of one or more substructures of the roughened surface in the surface plane of the encapsulant and perpendicular to this surface plane. By providing a discontinuity in addition to the roughened surface, the tendency of delamination of the functional structure (in particular a thermal interface structure) from the encapsulant can be efficiently reduced. Delamination can result in a separation between the two materials, and may deteriorate the function (e.g. isolation, corrosion, contamination, humidity, optical artefacts, mechanical integrity).

In an embodiment, the discontinuity is formed as an annular indentation in the surface portion of the encapsulant covered by the functional structure. Correspondingly, the method may further comprise forming a discontinuity, in particular an annular indentation, in the encapsulant adjacent to, in particular surrounding, the roughened surface portion of the encapsulant. Thus, in particular the path length along which a creep current has to propagate for short-circuiting the electronic component can be significantly increased by a ring like indentation surrounding the entire carrier. Thus, the electric breakdown voltage of the electronic component or package may be rendered very high.

In an embodiment, the roughened surface of the encapsulant is located adjacent to, in particular surrounding, at least part of the discontinuity. More specifically, the roughened surface may selectively surround only the discontinuity, i.e. may be provided solely in a direct environment of the discontinuity, whereas more remote surface portions of the encapsulant may have a smaller roughness or may be smoother than the locally roughened surface. This has turned out to be a highly efficient measure in terms of increasing the adhesion strength between encapsulant and the functional structure applied or formed thereon. By higher roughness, the surface between the two structures is increased. This may also result in an increase of an electric path length and can finally result in a higher breakdown voltage or in a smaller package dimension.

In an embodiment, the roughened surface of the encapsulant has a locally limited higher roughness than another lower roughness in a remaining (for instance the entire remaining) surface of the encapsulant. In other words, the roughened surface may have a roughness value (in particular a value Ra) being larger than a roughness value in other adjacent or neighboring surface portions of the encapsulant.

In an embodiment, the method comprises treating the already previously roughened surface of the encapsulant (i.e. treating after the roughening) by a plasma (for instance a chemical plasma). Examples for suitable plasma treatments are treatment by an argon plasma, an oxygen plasma, a hydrogen plasma, etc., and mixtures thereof. A CO or a COH group becomes polar or polarized and is thereby brought to a binding-affine state by the plasma treatment, and additional sub-micrometer roughness of all exposed encapsulant surfaces may be achieved. Treating the roughened surface with a plasma prior to the connection of the roughened surface of the encapsulant with the functional structure has turned out to be capable of activating the roughened surface which additionally increases surface adhesion and furthermore promotes the secure connection between encapsulant and structure. For instance, surface activation may generate active OH-groups at the roughened surface (and preferably additionally on adjacent surface portions) which further promotes a delamination free behaviour of the encapsulant-functional structure arrangement even under mechanical and/or thermal stress. While roughening may be a locally restricted treatment of only a sub-portion of the encapsulant surface, plasma treatment may be spatially unspecific and may be carried out on the entire encapsulant surface.

Additionally or alternatively to the described plasma treatment, it is possible to clean the roughened surface of the encapsulant after the roughening and before the connection to the functional structure. This additionally promotes a delamination free adhesion of the functional structure on the encapsulant.

Both plasma treatment and cleaning, in addition to the roughening, are considered to reduce the tendency of delamination of the functional structure from the encapsulant under stress acting on the electronic component. Such a stress may be the result of an autoclave treatment (as a stress test), may be the result of high temperature storage (as a stress test), and/or may be the result of heat generation of the encapsulated electronic chip during operation. In all three cases, stress may be the result. Environmental stress accelerates aging of the border surface.

In terms of a particularly advantageous process flow, forming the encapsulant (in particular by molding) with roughened surface may be followed by a pre-anneal procedure for removing humidity. Subsequently, a plasma activation and/or a cleaning procedure may be carried out. After that, the functional structure may be formed, for instance by a further mold procedure.

In an embodiment, the roughening is carried out during (and hence simultaneously with) the encapsulating by using an encapsulation tool having a roughened interior tool surface with a shape being inverse to the shape of the roughened surface of the encapsulant created with the encapsulation tool. This is highly preferred, since the simultaneous formation of the roughened surface with the encapsulation procedure renders a separate roughening procedure dispensable. Hence, the manufacturing procedure may be accelerated. In a preferred embodiment, encapsulating is accomplished by molding using a molding tool as the encapsulation. In such a scenario, a section of an interior surface of the molding tool defining the shape of the electronic component to be manufactured can be roughened with a negative or inverse pattern as compared to the pattern or shape defining the roughened surface of the encapsulant. Such a procedure also allows for a precise definition of the surface topology of the roughened surface.

Correspondingly, the discontinuity may be formed by encapsulating with an encapsulation tool having an inverse discontinuity as compared to the discontinuity of the encapsulant created with the encapsulation tool.

In another embodiment, the roughening is carried out after the encapsulating, in particular by laser processing or a mechanical treatment. Correspondingly, the discontinuity may be formed by laser processing or a mechanical treatment. By laser processing, one or more selective surface portions of the encapsulant can be roughened by simply moving a laser device over corresponding surface portions of the encapsulant. As an alternative procedure of roughening after encapsulating without laser processing, mechanical roughening is possible. In such an embodiment, a surface of the encapsulant can be roughened by a mechanical treatment such as grooving or grinding.

In one embodiment, only a surface portion of the encapsulant, which surface portion neighbours (in particular surrounds) a discontinuity is selected roughened, because such a surface portion is considered to have the most significant impact on the lamination strength between the encapsulant and the functional structure. However, to further increase the protection against undesired delamination of the functional structure from the encapsulant also an entire or a partial surface of the discontinuity may be optionally roughened, for instance a bottom surface of a recess-type discontinuity. Roughening at least a part of the surface of a discontinuity may be carried out in the same procedure by which surface roughening of the encapsulant outside of the discontinuity is accomplished. For instance, a molding tool may be correspondingly provided with an inverse structure with regard to a roughening surface of the encapsulant next to the position of the molding tool which has an inverse shape compared to the discontinuity.

In an embodiment, at least part of the surface portion of the carrier covered by the functional structure is roughened. By additionally roughening a connection surface of the carrier, to be covered by the functional structure, the protection against delamination of the functional structure can be further improved.

In an embodiment, the functional structure is an electrically insulating and thermally conductive interface structure, i.e. is made of a thermal interface material (TIM). A thermal interface material may contribute to the removal of heat from the electronic chip during operation of the electronic component. Such an embodiment has the advantage that a reliability of the thermal coupling between an encapsulant and an electrically conductive carrier on the one hand and an electrically insulating and thermally conductive thermal interface structure on the other hand can be significantly improved by the surface roughening of the encapsulant in a surface portion surrounding the carrier. By taking this measure, undesired mechanical delamination of the thermal interface structure from the encapsulant can be safely prevented due to the increased and more complicated contact surface between these two elements. The formation of electric creep currents from an exterior of the electronic component or package up to the encapsulated and surface covered carrier via a gap between encapsulant and thermal interface structure can thereby also rendered highly unlikely, which improves the electric performance of electronic component. Moreover, a reliable connection between the encapsulant and the carrier on the one hand and the thermal interface structure on the other hand significantly improves the thermal performance of the electronic component or package, since heat generated by the encapsulated electronic chip during operation of the electronic component can be removed efficiently via the thermal interface structure, for example to a heat dissipation body which may be externally attached to the thermal interface structure.

In an embodiment, a through hole extends at least through the encapsulant and the functional structure so that a fastening element (such as a screw or a bolt) is guidable through the through hole for fastening the electronic component, for instance to a heat dissipation body in case of a TIM-type functional structure. In an embodiment, the fastening element may form part of the electronic component. Mounting the electronic component to a heat dissipation body or any other body by a fastening element such as a screw is simple and cheap.

In an embodiment, the electronic component comprises a clip configured for connecting the electronic component to another body such as a heat dissipation body. Such a clip may be configured to clamp the encapsulated chip-carrier arrangement with thermal interface coating against the heat dissipation body without the need to form a through hole. Although the effort for connecting a heat dissipation body to the rest of the electronic component by a clip is somewhat higher than by a fastening element such as screw, it is nevertheless advantageous in particular for high-performance applications. In an embodiment involving a clip, it has turned out advantageous to form the functional structure with a convex surface facing the heat dissipation body. With such a configuration, the convex surface deforms into a substantially planar surface upon applying pressure with the clip, thereby ensuring an air gap free full surface contact between interface structure and the dissipation body.

The functional structure may be a foil to be connected to the rest of the electronic component by lamination. Alternatively, it is possible to form the functional structure by encapsulation, printing, dispensing, deposition.

For example, the functional structure may have a thickness in a range between 10 µm and 1000 µm, in particular in a range between 50 µm and 500 µm. For instance, thermal conductivity of the material of the functional structure may be in a range between 1 W m$^{-1}$ K$^{-1}$ and 30 W m$^{-1}$ K$^{-1}$, in particular in a range between 2 W m$^{-1}$ K$^{-1}$ and 8 W m$^{-1}$ K$^{-1}$. Thermal conductivity of the material of the thermal interface structure (as an embodiment of the functional structure) may be higher than thermal conductivity of the material of the encapsulant. For instance, thermal conductivity of the material of the encapsulant may be in a range between 0.2 W m$^{-1}$ K$^{-1}$ and 6 W m$^{-1}$ K$^{-1}$, in particular in a range between 0.8 W m$^1$ K$^1$ and 2 W m$^1$ K$^1$. For example, the material of the thermal interface structure may be a silicone-based material (or may be made on the basis of any other resin-based material, and/or combinations thereof) which may comprise filler particles for improving thermal conductivity. For example, such filler particles may comprise or consist of aluminum oxide (and/or silicon nitride, boron nitride, aluminum nitride, diamond, etc.).

In an embodiment, the material of the encapsulant and/or the functional structure may be based on sheets, pellets, granulate and/or liquid.

In another embodiment, the functional structure is an optically transparent structure. Correspondingly, the electronic chip may be configured for emitting and/or receiving electromagnetic radiation and the functional structure may be transparent for the transmitted electromagnetic radiation. Such an embodiment is shown in FIG. 15. In order to promote a reliable adhesion between the optically transparent structure and the encapsulant, selective roughening of at least a part of a connection surface of the encapsulant to be connected to the optically transparent structure may be advantageous.

In yet another embodiment, the functional structure is a magnetic structure, in particular a permanent magnetic structure, more particularly a ferromagnetic structure. For instance, the electronic chip may be a sensor chip and the functional structure may be magnetic for generating a magnetic field acting on the sensor chip. Such an embodiment is shown in FIG. 15. In order to promote a reliable adhesion between the magnetic structure and the encapsulant, selective roughening of at least a part of a connection surface of the encapsulant to be connected to the magnetic structure may be advantageous.

In still another embodiment, the functional structure is configured to provide for a mechanical decoupling of a microelectromechanical structure (MEMS). In such an MEMS which may involve a movable element, it may be necessary to mechanically decouple one element from another element. Advantageously, this may be accomplished with a low Young modulus.

In an embodiment, the encapsulant is a first mold compound and the functional structure is a second mold compound differing from the first mold compound in at least one material and/or physical property. By roughening a surface portion of a mold compound, adhesion of another mold compound thereon can be improved.

In an embodiment, the locally restricted formation of the roughened surface only on a sub-portion of the surface of the encapsulant may be accomplished by using a roughening procedure which only acts on this sub-portion of the surface of the encapsulant. For instance, a laser processing may be carried out in which the roughening laser beam only impinges on the sub-portion of the surface of the encapsulant to be roughened, but not on other surface portions of the encapsulant. In another example, a mechanical roughening process may be carried out in which the roughening mechanical treatment is carried out only on the sub-portion of the surface of the encapsulant to be roughened, but not on other surface portions of the encapsulant. In yet another example, a chemical roughening process may be carried out in which the roughening chemical treatment is carried out only on the sub-portion of the surface of the encapsulant to be roughened, but not on other surface portions of the encapsulant (which may be protected against the chemical roughening by a protection layer protecting certain surface regions of the encapsulant from roughening and which may be removed after the roughening procedure).

In an embodiment, the apparatus further comprises a functional structure formation tool configured for forming a functional structure covering a surface portion, including the roughened surface, of the formed encapsulant. Such an embodiment is shown in FIG. 6. For example, a compression molding tool may be implemented as the functional structure formation tool. After having manufactured the encapsulant with the exclusively partially and hence spatially selectively roughened surface portion as compared to a smoother adjacent remaining surface of the encapsulant in the encapsulation tool, a preform of the functional structure may be inserted into the functional structure formation tool so as to cover also the roughened surface of the encapsulant, so that proper adhesion is obtained between encapsulant and functional structure as a result of the increased connection surface thanks to the roughening.

In the foregoing description, three examples (TIM, optically transparent material, magnetic material) have been given for structures to be reliably connected to the encapsulant for increasing functionality of the manufactured electronic component or package while simultaneously ensuring reliability. Embodiments of the invention are however not limited to these three examples, but also cover other applications in which a functional structure (for instance thermally functionally, electrically functionally, optically functionally, magnetically functionally, etc.) is to be connected to the encapsulant with a reliable protection against undesired delamination. This particularly holds for a scenario in which two mold compounds with different properties are to be combined, wherein in such an embodiment the encapsulant is realized as a first mold compound and the functional structure is realized as a second mold compound. A gist of such embodiments can then be seen in the roughening of a surface of the first mold compound before connecting it with the second mold compound. Molding twice may be carried out for combining two different material properties provided by the first mold compound and the second mold compound. Examples for the two different material properties are the property pairs "magnetic-nonmagnetic", "transparent-opaque", "expensive-cheap", "thermally conductive-poorly thermally conductive", "hard-soft".

However, it is alternatively also possible that the second encapsulant is another encapsulant than a mold compound. For instance, it is possible that the second encapsulant is dispensed, casted, printed, molded, etc. The same holds for the first encapsulant. In an exemplary further application, the separation between first encapsulant and second encapsulant (in particular with a second encapsulant being dispensed, casted, printed, etc. rather than being molded) serves for a mechanical decoupling. For instance, this may be advantageous in a pressure sensor, or in a microelectromechanical system (MEMS) (such as a microphone or an acceleration sensor).

In an embodiment, the carrier comprises or consists of a leadframe. A leadframe may be a metal structure inside a chip package that is configured for carrying signals from the electronic chip to the outside, and/or vice versa. The electronic chip inside the package or electronic component may be attached to the leadframe, and then bond wires may be provided for attach pads of the electronic chip to leads of the leadframe. Subsequently, the leadframe may be moulded in a plastic case or any other encapsulant. Outside of the leadframe, a corresponding portion of the leadframe may be cut-off, thereby separating the respective leads. Before such a cut-off, other procedures such a plating, final testing, packing, etc. may be carried out, as known by those skilled in the art. Alternative chip carriers which may be used for other embodiments can be any interposer like a substrate, a ceramic substrate, a laminar substrate, a DCB (Direct Copper Bonded Substrate), an IMS (Insulated Metal Substrate), a PCB (printed circuit board), etc. Chip embedding is also an option.

In an embodiment, the electronic component further comprises the above-mentioned heat dissipation body attached or to be attached to the interface structure for dissipating heat generated by the electronic chip during operation of the electronic component. For example, the heat dissipation body may be a plate of a properly thermally conductive body, such as copper or aluminium or graphite, diamond, composite material and/or combinations of the mentioned and/or other materials, which may have cooling fins or the like to further promote dissipation of heat which can be thermally conducted from the electronic chip via the chip carrier and the interface structure to the heat dissipation body. The removal of the heat via the heat dissipation body may further be promoted by a cooling fluid such as air or water (more generally a gas and/or a liquid) which may flow along the heat dissipation body externally of the electronic component.

In an embodiment, the electronic component is adapted for double-sided cooling. For example, a first interface structure may thermally couple the encapsulated chip and carrier with a first heat dissipation body, whereas a second interface structure may thermally couple the encapsulated chip and carrier with a second heat dissipation body. In this case, two roughened surface portions of the encapsulant can be provided.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

For the encapsulating, a plastic material or a ceramic material may be used. The encapsulant may comprise an epoxy material. Filler particles (e.g. $SiO_2$, $Al_2O_3$, $Si_3N_4$, BN, AlN, diamond, etc.), for instance for improving thermal conductivity may be embedded in an epoxy-based matrix of the encapsulant.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

In an embodiment, the interface structure may be provided with an adhesion layer for adhering to the electronic component and/or to the dissipation body. It is possible to equip such an interface structure with a removable protection foil which can be removed prior to adhering the interface structure.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 9 to FIG. 11 show characteristics of surface topologies of an encapsulant in accordance with different manufacturing procedures.

FIG. 14 illustrates a cross-sectional view of an electronic component, embodied as a light-emitting diode package with an optically transparent mold structure providing an optical transmission capability, according to an exemplary embodiment of the invention.

FIG. 15 illustrates a cross-sectional view of an electronic component, embodied as a sensor package with a magnetic mold structure providing a magnetic field generation capability, according to an exemplary embodiment of the invention.

DETAILED DESCRIPTION

Figure 1:
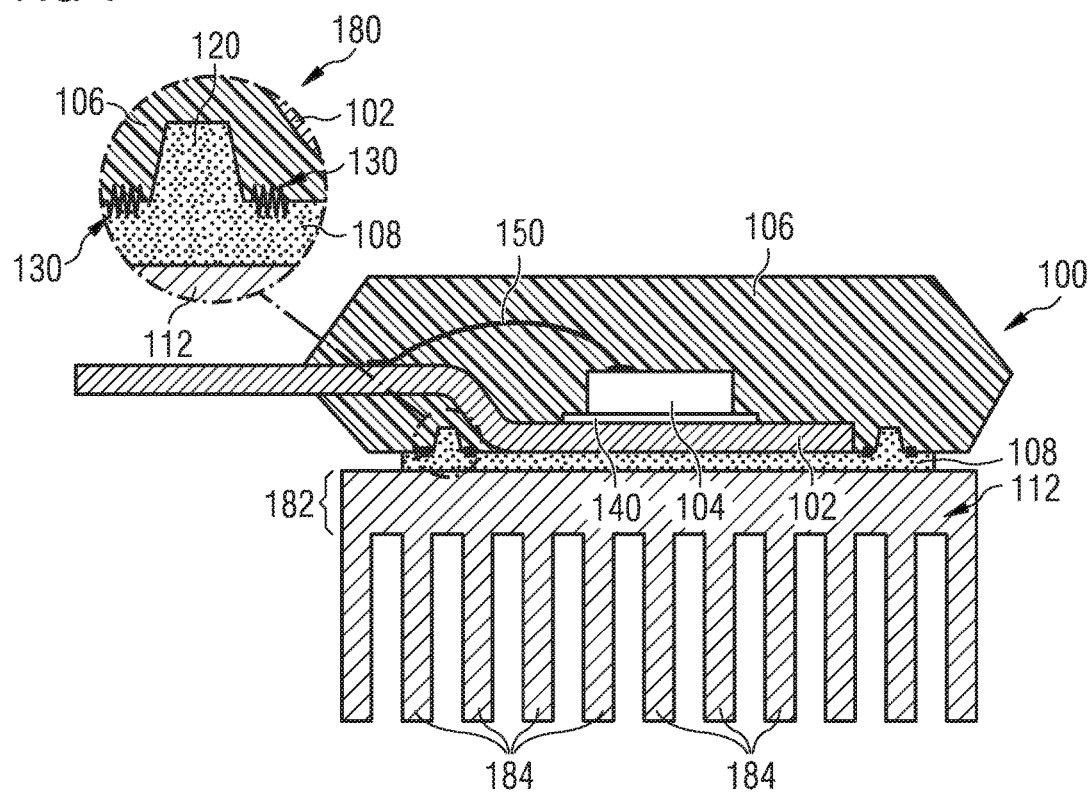
FIG. 1 illustrates a cross-sectional view of an electronic component, embodied as a power semiconductor package with a thermal interface structure providing a heat removal capability, according to an exemplary embodiment of the invention.

The illustration in the drawing is schematically and not to scale.

Before exemplary embodiments will be described in more detail referring to the figures, some general considerations will be summarized based on which exemplary embodiments have been developed.

According to an exemplary embodiment of the invention, selective package roughening may be carried out for improved adhesion and/or for reliably providing a further function (such as isolation, thermal coupling, etc.) of a functional structure on an encapsulant. For this purpose, specifically a connection surface (or part thereof) of the encapsulant may be selectively roughened during and/or after its manufacture.

Provision of a thermally conductive isolation or thermal interface material (TIM), as an example for a functional structure, of electronic components or packages such as molded power devices is frequently done by an end customer. Such an approach is costly and limits the performance of the package or application. An external isolation takes over this function by a package feature. The TIM layer should be delamination free during the complete life-time of the package to ensure that the package complies with requirements of a proper safety class. For instance, the electric disruptive strength of the manufactured electronic component should be at least 2.5 kV in certain power applications. A TIM structure may also provide the function of being compressible, in addition to its heat removal function.

An isolation in lateral direction can be conventionally realized by a fan-out approach, i.e. the isolation layer sheet may be larger than the package or die pad. An isolation in accordance with a fan-in approach means that it has to be ensured by a proper adhesion between mold compound (or another encapsulant) and TIM layer (or another structure).

According to an exemplary embodiment of the invention, a selectively roughened molded package (more generally an electronic component with a roughened surface of a (preferably spatially limited) surface region of an encapsulant covered by a functional structure such as a thermal interface structure) is provided, preferably although not necessarily in combination with a post-roughening plasma surface activation to obtain a proper adhesion between package and TIM material. Such an embodiment has the advantage of providing the possibility of parallel processing which also results in low manufacturing effort. As compared to another embodiment in which roughening is accomplished by laser roughening or mechanical roughening, elimination of one separate process step is possible by roughening during encapsulation. Advantageously, such an embodiment involves no risk of undesired carbonisation of a transfer mold compound.

A gist of an exemplary embodiment of the invention is the provision of a molded power package (or a molded module) with selective roughening of the mold-tool surface for obtaining an improved adhesion (resulting in a delamination-free electronic components or package) between isolation layer and mold compound. Thus, a proper thermal performance may be combined with a high isolation safety and hence a high disruptive strength of a power device or any other electronic component package.

An advantageous aspect of an embodiment of the invention is therefore the provision of a molded power device with selective roughening of the mold compound as encapsulant for an improved adhesion (i.e. a substantially delamination-free characteristic) between the attached structure (such as an isolation layer, more specifically a thermally conductive and electrically insulating thermal interface material) and the mold compound (or more generally an encapsulant, which may for instance also be a laminate) to achieve a robust electric isolation realized by molding. Studies have shown that the described surface roughening of at least a connection surface of the encapsulant with the functional structure to be applied (in particular a TIM layer) significantly inhibits undesired delamination of the applied structure from the encapsulant.

An exemplary embodiment of the invention therefore advantageously combines the integration of a molded package and an advanced isolation performance after a backend process. By exemplary embodiments, the adhesion between an encapsulant, such as a molding compound (in the scenario of a molded package), and isolation material can be improved, thereby overcoming conventional delamination issues.

The skilled person will understand that an intrinsic mold roughness generated by a conventional manufacture of a package without carrying out a selective, specific and intentional roughening procedure may be in a range between 0.4 µm and 0.8 µm (spatially unspecific). However, such an intrinsic mold surface roughness is less than 1 µm due to manufacturability limitations (in particular in view of mold compound sticking and cleaning frequency). However, a package roughness below 1 µm results in a package which is prone to delamination of a functional structure such as a TIM layer from an encapsulant.

In contrast to this, an exemplary embodiment provides a selective and spatially defined package roughening limited to a connection area of the encapsulant with a functional structure. In particular, a molded package is foreseen with selective surface roughening which has turned out to provide for a better adhesion between encapsulant and functional structure (for instance TIM material) formed thereon. This may have the advantage of providing the opportunity of parallel processing and therefore lower manufacturing effort. Furthermore, such an architecture allows for the elimination of a separate roughening step when integrating the roughening into the encapsulation procedure by a roughening generating shaping of an encapsulation tool. Beyond this, an undesired effect of carbonisation of a transfer mold compound does not occur with such an architecture.

FIG. 1 illustrates a cross-sectional view of an electronic component 100 according to an exemplary embodiment of the invention which is embodied as a Transistor Outline (TO) electronic component.

The electronic component 100, which can also be denoted as a semiconductor package, comprises an electrically conductive chip carrier 102 which is here embodied as a leadframe. Moreover, an electronic chip 104, which is here embodied as a power semiconductor chip, is mounted on the carrier 102, for instance via an adhesive 140. One or more chip pads of the electronic chip 104 may be electrically coupled with the chip carrier 102 via one or more bond wires 150. An encapsulant 106, for instance a mold compound which may be made of an epoxy-based material with silicon oxide based filler particles, encapsulates a part of the carrier 102. The material of the encapsulant 106 may have a thermal conductivity of approximately 1 W m$^{-1}$ K$^{-1}$ and has electrically insulating properties. However, another part of the carrier 102 extends beyond the encapsulant 106 and is therefore exposed to an environment. Also the electronic chip 104 is encapsulated by the encapsulant 106.

In addition, an electrically insulating and thermally conductive interface structure, which may be denoted as a functional structure 108, is provided which covers an exposed surface portion of the carrier 102 and a connected surface portion of the encapsulant 106 so as to electrically decouple the covered surface of the carrier 102 from an environment.

For fastening the electronic component 100 to a heat dissipation body 112 (which is here configured as a heat sink with cooling fins), a through hole 114 (see FIG. 2) can be formed to extend through the encapsulant 106 and the functional structure 108 so that a fastening element 116 (see FIG. 12), here a screw, is guidable through the through hole 114 and into the heat dissipation body 112 for fastening the heat dissipation body 112 to the remainder of the electronic component 100. Consequently, the heat dissipation body 112 is connected with direct contact to the functional structure 108. As a result, heat being generated by the electronic chip 104 during operation of the electronic component 100 can be dissipated via the carrier 102 and the encapsulant 106, and via the functional structure 108 towards the heat dissipation body 112 and from there to the environment. In the shown embodiment, the heat dissipation body 112 is an integral body of high thermal conductivity comprising a base structure 182 directly contacting the functional structure 108 and comprises a plurality of cooling fingers or fins 184 extending from the base structure 182.

The functional structure 108 may have a vertical thickness of about 300 µm (for instance may have a thickness in a range between 50 µm and 1000 µm, in particular in a range between 100 µm and 500 µm) and may be made of a silicone-based matrix filled with aluminum oxide based filler particles. It may have a thermal conductivity of approximately 5 W m$^{-1}$ K$^{-1}$ and may have electrically insulating properties. The functional structure 108 simultaneously fulfils different functions: on the one hand, it covers an exposed surface portion of the carrier 102 as well as adjacent portions of the encapsulant 106 and therefore serves as an electric insulation preventing an electric current from flowing between an interior and an exterior of the encapsulant 106. On the other hand, the functional structure 108 is thermally conductive and allows to conduct thermal energy out of an interior of the encapsulant 106, i.e. from the electronic chip 104 towards an environment. Therefore, the functional structure 108 has also a cooling function.

A discontinuity 120, embodied as an annular groove in the encapsulant 106, is formed in the surface portion of the encapsulant 106 covered by the functional structure 108. The discontinuity 120 may be formed during the encapsulation procedure by a corresponding shaping of an encapsulation tool (such as a mold tool), or alternatively by laser processing. As can be taken from a detail 180 in FIG. 1, a part of the connected surface portion of the encapsulant 106 surrounding the discontinuity 120 is roughened to thereby form a spatially selectively roughened surface 130 of the encapsulant 106. Thus, the discontinuity 120 is formed as a macroscopic annular indentation in the surface portion of the encapsulant 106 covered by the functional structure 108. The roughed surface 130 forms a microscopic annular surrounding of the discontinuity 120. Thus, the method carried out for manufacturing the electronic component 100 according to FIG. 1 comprises forming the discontinuity 120, which is here embodied as an annular indentation, in the encapsulant 106 adjacent to and surrounded by the roughened surface 130 of the encapsulant 106. More specifically, two annular surface areas of the encapsulant 106 surrounding an interior and an exterior of the annular discontinuity 120, respectively, are selectively roughened to thereby form the roughened surface 130, whereas other surface portions of the encapsulant 106 are not roughened. More specifically, the surface roughness of the roughened surface 130 of the encapsulant 106 surrounding the discontinuity 120 is higher (for instance Ra=2.5 µm) than the surface roughness (for instance Ra=0.4 µm) of the smoother remaining surface of the encapsulant 106. As will be described below in further detail, surface roughening of the encapsulant 106 around the discontinuity 120 under formation of the roughened surface 130 may be created by a corresponding spatially limited roughening of an inner surface portion of a molding tool by which the encapsulant 106 is manufactured. This inner surface portion of the molding tool may define the roughened surface 130 of the encapsulant 106 during the molding and may therefore emboss an inverse topology of the roughened inner surface portion of the molding tool into the encapsulant 106 as roughened surface 130 into the thereby roughened surface 130 of the encapsulant 106. As a result of this manufacturing process of the roughened surface 130, it has an even or uniform and substantially periodic roughness profile (see FIG. 11).

In view of the described manufacturing process, the roughened surface 130 of the encapsulant 106 has a locally limited higher roughness than another lower roughness in a remaining surface of the encapsulant 106. This combines two advantages: On the one hand, the roughened surface 130 of the encapsulant 106 increases adhesion with the functional structure 108 by increasing the effective connection area between encapsulant 106 and functional structure 108. On the other hand, spatially limiting the roughening surface 130 to the two rings on the inner and the outer circumference of the annular indentation-type discontinuity 120, it can be prevented that an excessive roughening of the encapsulant 106 renders removal of the electronic component 100 out of an encapsulation tool complicated in view of an excessive adhesion between the encapsulant 106 and the encapsulation tool. If the latter adhesion becomes too pronounced, removal of the electronic component 100 out of the encapsulation tool may require additional measures such as auxiliary tools and/or auxiliary treatment. While also a significant or even full surface roughening of the encapsulant 106 is possible according to certain embodiments of the invention, a selective spatially limited roughening of a small portion of the encapsulant's surface area (for instance not more than 10% of the surface area of the encapsulant 106) is preferred. Local roughening simultaneously with the formation of the encapsulant 106 is highly advantageous, since this renders a separate roughening procedure dispensable.

In order to further improve adhesion of the functional structure 108, it is optionally also possible that at least part of the surface portion of the carrier 102 covered by the encapsulant 106 is roughened as well.

Moreover, for further significantly improving adhesion between the functional structure 108 and the encapsulant 106, the roughened surface 130 of the encapsulant 106 can be optionally treated by a plasma after the roughening procedure. If desired, cleaning of the roughened surface 130 may be carried out additionally or alternatively to the plasma activation prior to coverage of the roughened surface 130 by the functional structure 108. This further suppresses undesired delamination of functional structure 108 from the encapsulant 106.

Figure 2:
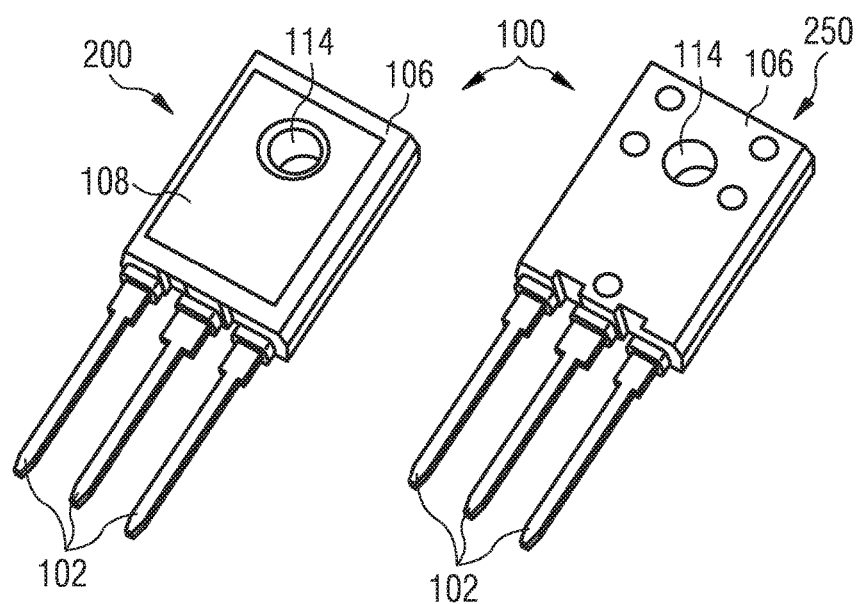
FIG. 2 illustrates a three-dimensional front view and back view of the electronic component according to FIG. 1.

FIG. 2 illustrates a three-dimensional front view 200 and a three-dimensional back view 250 of the electronic component 100 according to FIG. 1. As can be taken from FIG. 2, a through hole 114 may be provided which extends through the encapsulant 106 and the functional structure 108 so that a fastening element (see reference numeral 116 in FIG. 12), for instance a screw, is guidable through the through hole 114 for fastening the electronic component 100 to heat dissipation body 112.

Figure 3:
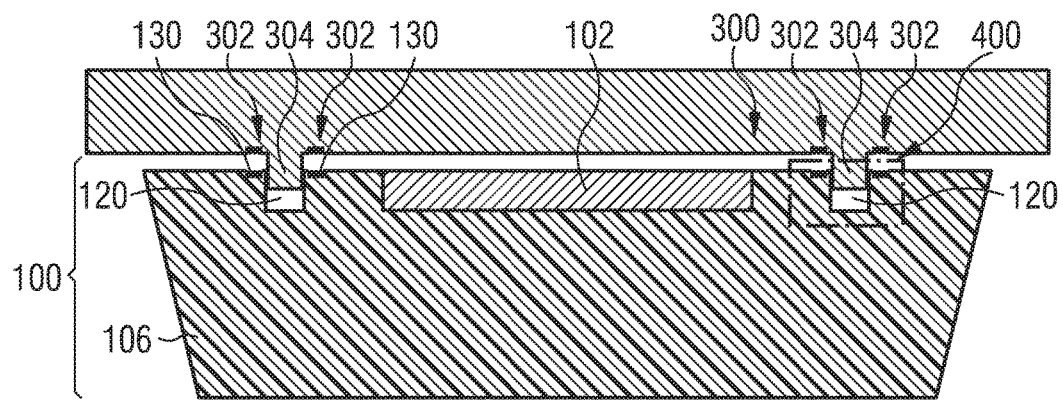
FIG. 3 illustrates an encapsulation tool of a manufacturing apparatus and a part of an electronic component prior to applying a thermal interface structure according to an exemplary embodiment of the invention.

FIG. 3 illustrates a part of an encapsulation tool 300, here embodied as upper mold tool, whereas a lower mold tool of the encapsulation tool 300 is not shown in FIG. 3. FIG. 3 furthermore shows a part of an electronic component 100 prior to applying a thermal interface structure or any other functional structure 108 according to an exemplary embodiment of the invention. According to FIG. 3, roughening is carried out during encapsulating using the encapsulation tool 300 having an inverse roughened surface 302. Correspondingly, also the discontinuity 120 is formed by and during encapsulating with the encapsulation tool 300 having an inverse discontinuity 304. Thus, by the manufacturing procedure according to FIG. 3, no separate manufacturing procedures are necessary neither for forming the discontinuity 120 nor for forming the spatially limited selective roughened surface 130 in the encapsulant 106. In contrast to this, the mentioned features (see reference numerals 120, 130) are formed simultaneously with the molding. It can also be taken from FIG. 3 that all other surface areas (different from the roughened surfaces 130) of the encapsulant 106 are smooth, or more precisely smoother than the roughened surface 130. The package roughness at the roughened surface 130 is defined by a corresponding design of the mold or encapsulation tool 300. Hence, after the molding, the roughened surface 130 of the encapsulant 106 is already readily manufactured. Thus, FIG. 3 shows a molded package selective surface roughening for better adhesion. Optionally, an in-line plasma process may be carried out for additionally activating the roughened surface 130 for further promoting adhesion of functional structure 108 thereon. With this plasma process, either selectively the roughened surface 130 of the encapsulant 106, or the entire exposed surface of the encapsulant 106 may be surface activated. The plasma or plasma batch process may be incorporated in a compression mold machine for activating the roughened surface 130 (for instance removal of impurities) for further improved adhesion of the here electrically isolating functional structure 108. By taking this measure, a delamination free concept is realized.

Figure 4:
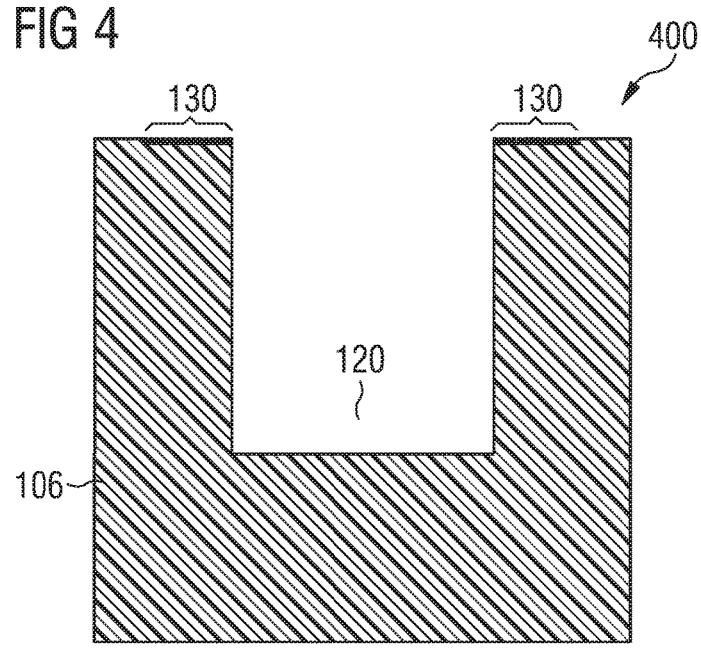
FIG. 4 illustrates a detailed view of a surface portion of an encapsulant with a locally limited roughened surface surrounding a discontinuity manufactured according to FIG. 3.

FIG. 4 illustrates a detail 400 of the surface portion of the encapsulant 106 with roughened surface 130 surrounding discontinuity 120 and manufactured according to FIG. 3. The roughened surface 130 provides for a proper adhesion, whereas the remaining smoother surface region of the encapsulant 106 ensures that the molded electronic component 100 may be easily removed from the encapsulation tool 300 after formation of the encapsulant 106.

Figure 5:
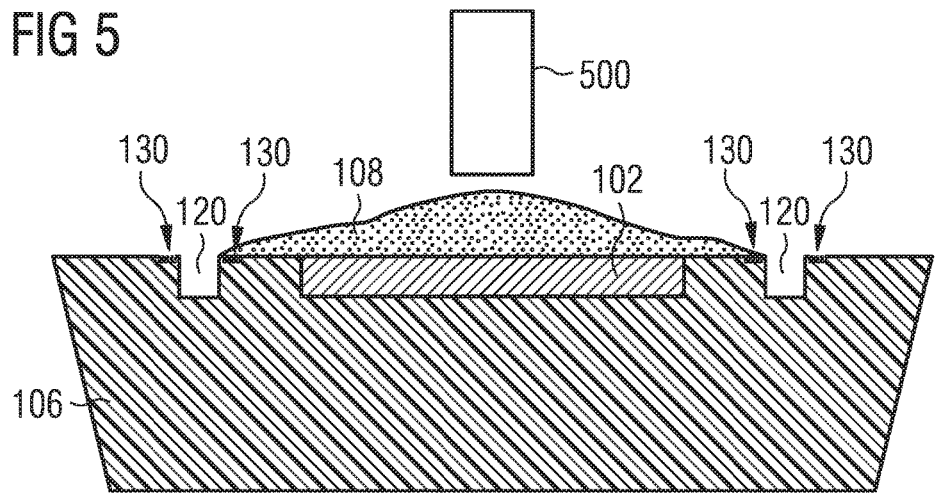
FIG. 5 and FIG. 6 illustrate a procedure of connecting a thermal interface structure to a remainder of an electronic component using a manufacturing apparatus according to an exemplary embodiment of the invention.
Figure 6:
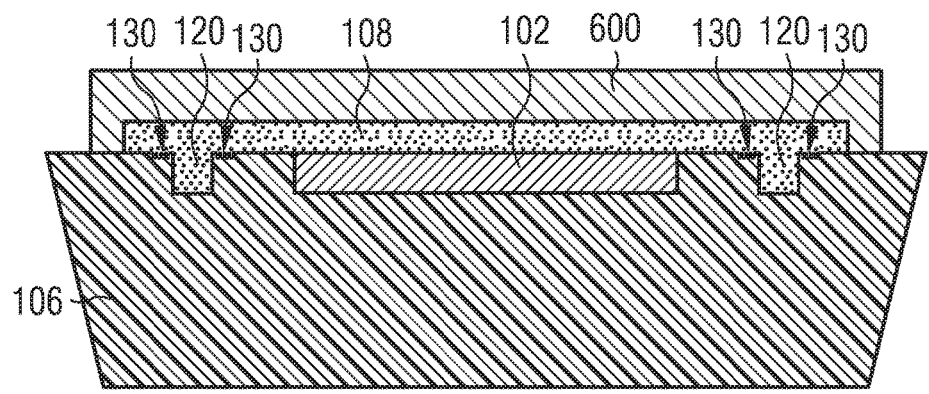

FIG. 5 and FIG. 6 illustrate a procedure of connecting a thermal interface material (TIM) as functional structure 108 to a remainder of an electronic component 100 according to an exemplary embodiment of the invention.

As can be taken from FIG. 5, isolation material, later forming the functional structure 108, can be dispensed by a dispenser 500. Subsequently, the isolation material is shaped and connected to exposed surface portions of the chip carrier 102 as well as of the encapsulant 106 (in particular including the roughened surface 130 thereof) by compression molding, i.e. using a compression molding tool 600.

Figure 7:
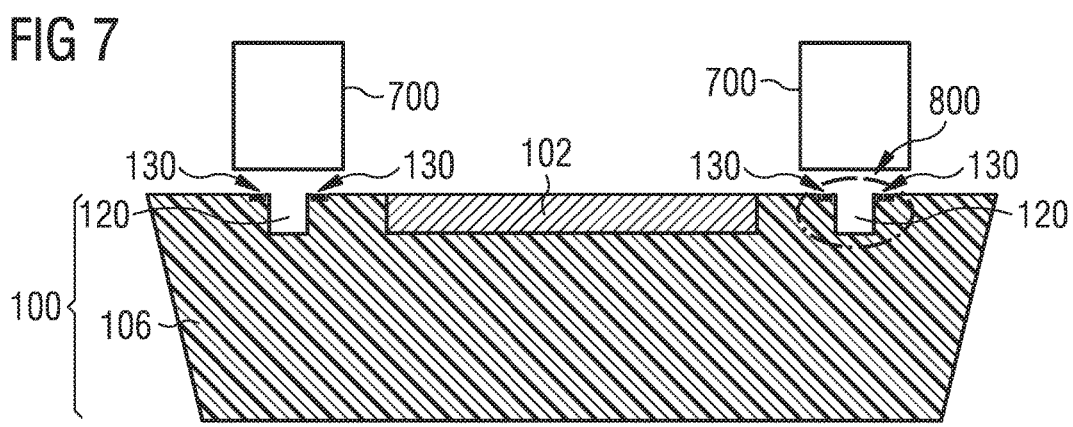
FIG. 7 illustrates a laser device and a part of an electronic component prior to applying a thermal interface structure according to an exemplary embodiment of the invention.

FIG. 7 illustrates a laser device 700 and a part of an electronic component 100 prior to applying a functional structure 108 according to an exemplary embodiment of the invention. According to FIG. 7, the roughening of a surface portion of the encapsulant 106 to thereby form the roughened surface 130 may be carried out after encapsulating by subsequent spatially limited laser processing. As an alternative to laser processing, it is also possible to manufacture the discontinuity 120 and/or the roughened surface 130 by mechanically drilling and/or grooving.

Figure 8:
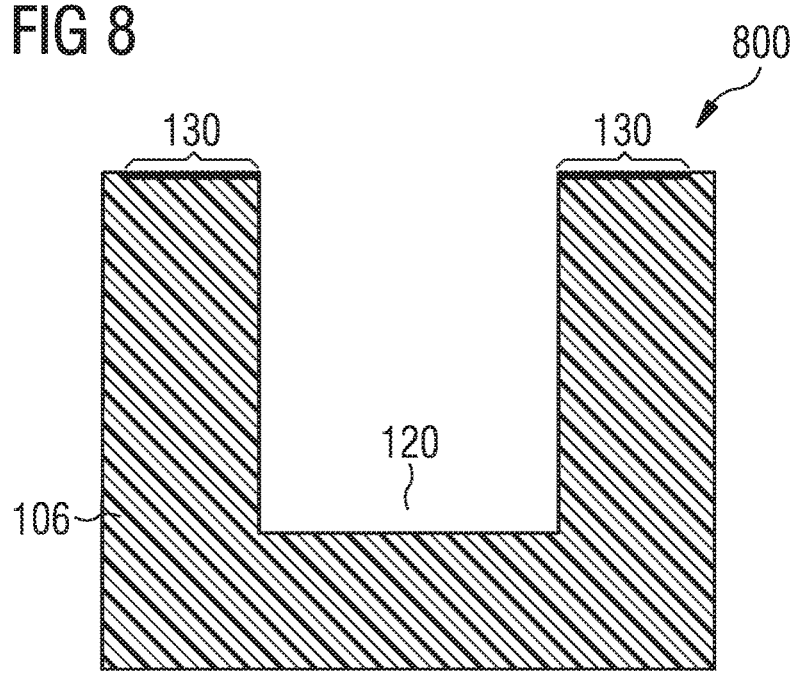
FIG. 8 illustrates a detailed view of a surface portion of an encapsulant with a roughened surface surrounding a discontinuity manufactured according to FIG. 7.

FIG. 8 illustrates a detail 800 of a surface portion of an encapsulant 106 with a roughened surface 130 surrounding a discontinuity 120 manufactured according to FIG. 7. FIG. 8 differs from FIG. 4 substantially concerning the shape of the protrusions defining the roughened surface 130, which is a consequence of the different manufacturing procedures (forming the roughened surface 130 by correspondingly shaping an encapsulation tool 300 according to FIG. 3 versus formation of the roughened structure 130 by laser processing according to FIG. 7), see FIG. 10 and FIG. 11 described below.

Figure 8A:
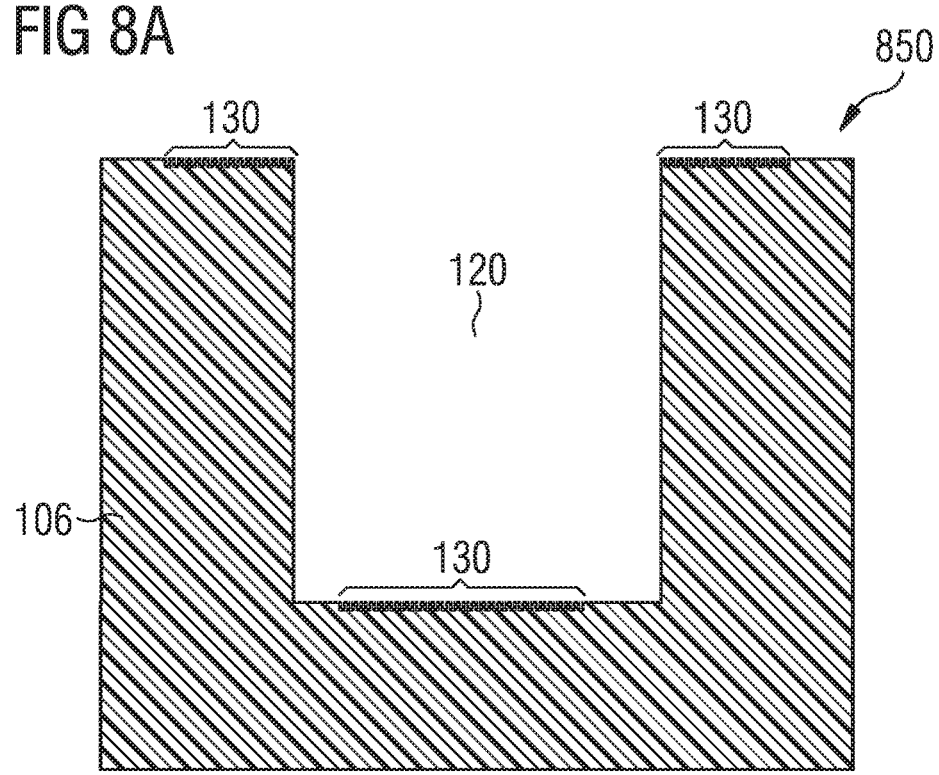
FIG. 8A illustrates a detailed view of a surface portion of an encapsulant with a roughened surface surrounding a discontinuity and at the bottom surface of the discontinuity which can be manufactured according to FIG. 3 or according to FIG. 7.

FIG. 8A illustrates a detail 850 of a surface portion of an encapsulant 106 with a roughened surface 130 surrounding a discontinuity 120 and at the bottom surface of the discontinuity 120, which can be manufactured according to FIG. 3 or according to FIG. 7. FIG. 8A differs from FIG. 3 and FIG. 7 in that, according to FIG. 8A, roughened surface 130 is not only formed around the discontinuity 120, but also within the discontinuity 120. More specifically, a portion of the roughened surface 130 is formed on the bottom surface of the discontinuity 120. Alternatively, it is also possible that the roughened surface 130 is formed only within the discontinuity 120, not around the discontinuity 120.

FIG. 9, FIG. 10 and FIG. 11 show characteristics of surface topologies in accordance with different manufacturing procedures.

FIG. 9 shows a relatively smooth surface 930 of an encapsulant 106 as manufactured with a mold tool without specifically roughened interior surface. The resulting surface topology shows small protrusions ("matte finish"). Hence, FIG. 9 shows an even or uniform roughness profile generated intrinsically by molding with a very shallow depth (Ra significantly below 1 µm, typically between 0.4 µm and 0.8 µm) due to manufacturability effects (mold release and cleaning frequency).

FIG. 10 shows a selectively roughened surface 130 of an encapsulant 106, wherein the roughened surface 130 is formed by laser processing. As can be taken from a comparison of FIG. 10 with FIG. 9, the protrusions of the roughened surface 130 are significantly deeper than the smaller protrusions of the relatively smooth surface 930. The topology according to FIG. 10 relates to laser grooving roughening. Unlike FIG. 9, FIG. 10 shows an uneven roughness profile. For example, the shown roughness may be in a range between 5 µm and 20 µm.

FIG. 11 shows a selectively roughened surface 130 of an encapsulant 106, wherein the roughened surface 130 is formed by correspondingly roughening an interior surface of an encapsulation tool 300. As can be taken from a comparison of FIG. 11 with FIG. 9, the protrusions of the roughened surface 130 are significantly deeper than the much smaller protrusions of the relatively smooth surface 930. As can be taken from a comparison of FIG. 11 with FIG. 10, the protrusions of the roughened surface 130 according to Figure are even and substantially periodic, whereas the protrusions of the roughened surface 130 according to Figure show a non-ordered random distribution. The topology according to FIG. 11 relates to mold tool roughening. Hence, FIG. 11 relates to selective package roughening. The topology according to FIG. 11 shows an even or uniform roughness profile with deeper roughness (Ra can be in a range between 2 µm and 4 µm) than according to FIG. 9. The mentioned roughness values in the selectively roughened area are advantageously no concern for ejection of a preform of the package out of the mold tool.

Figure 12:
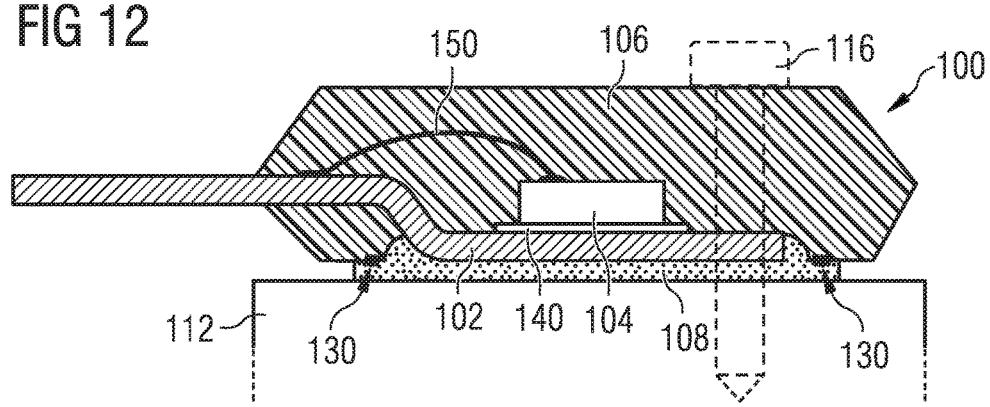
FIG. 12 and FIG. 13 illustrate cross-sectional views of electronic components with heat dissipation bodies on a thermal interface structure according to exemplary embodiments of the invention.

FIG. 12 illustrates a cross-sectional view of an electronic component 100 according to an exemplary embodiment of the invention which comprises a fastening element 116, which is here embodied as a screw, for fastening the package and the heat dissipation body 112.

Figure 13:
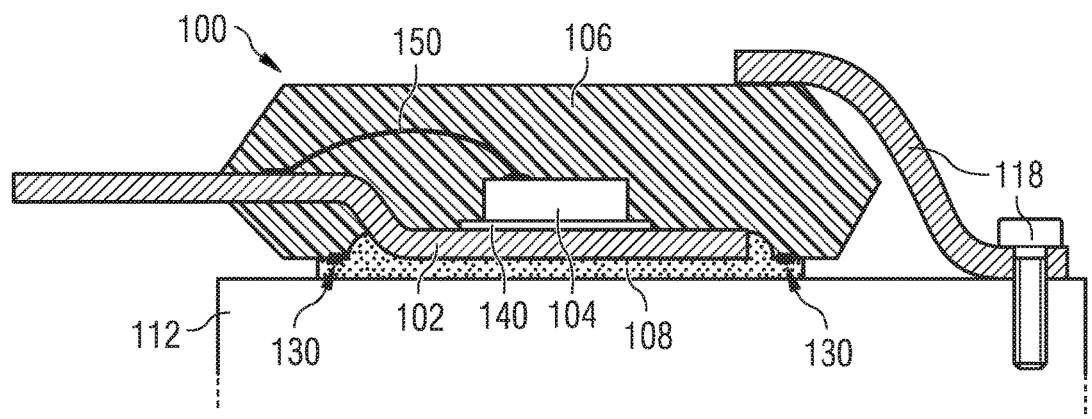

FIG. 13 illustrates a cross-sectional view of an electronic component 100 according to another exemplary embodiment of the invention. The electronic component 130 according to FIG. 13 comprises a clip 118 (rather than a screw) configured for connecting the electronic component 100 to the heat dissipation body 112.

FIG. 14 illustrates a cross-sectional view of an electronic component 100, embodied as a light-emitting diode (LED) package with an optically transparent mold structure in form of functional structure 108 providing an optical transmission capability, according to an exemplary embodiment of the invention.

The electronic chip 104, which is here embodied as LED, is mounted on a chip carrier 102, which can be embodied as a leadframe. Via one or more bond wires 150, the upper main surface of the electronic chip 104 is electrically contacted with the chip carrier 102. A silicone reflector is configured as a premolded body and is shown in FIG. 14 as encapsulant 106. Functional structure 108 is here embodied as a further mold compound, formed by compression molding, and can be an optically transparent material such as silicone. As can be taken from FIG. 14, sidewalls and a central wall portion of the encapsulant 106 are configured as locally roughened surfaces 130 so that adhesion between the encapsulant 106 on the one hand and the functional structure 108 on the other hand is enhanced. A lens body 1510 is also made of an optically transparent material and can be configured as a premolded silicone lens.

According to FIG. 14, the encapsulant 106 (which can be denoted as first encapsulant) can be formed by transfer molding, whereas the functional structure 108 (which can be denoted as second encapsulant) can be formed by compression molding.

FIG. 15 illustrates a cross-sectional view of an electronic component 100, embodied as a sensor package with a magnetic mold structure in form of functional structure 108 providing a magnetic field generation capability, according to an exemplary embodiment of the invention.

According to FIG. 15, an electronic chip (not shown) is encapsulated in encapsulant 106 in an interior of the package. A punched grid, which has two electric contacts in the shown embodiment, serves as chip carrier 102. The shown sensor package requires a permanent magnetic field for functioning properly. In the shown embodiment, this is accomplished by a permanent magnetic mold compound in form of functional structure 108. In order to promote adhesion between encapsulant 106 on the one hand and functional structure 108 on the other hand, a surface portion of the encapsulant 106 may be provided with a roughened surface (not shown in FIG. 15).

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic component, the electronic component comprising:
    an electrically conductive carrier;
    an electronic chip on the carrier;
    an encapsulant encapsulating at least part of at least one of the carrier and the electronic chip;

a functional structure covering a surface portion of the encapsulant;

a discontinuity which is formed in the surface portion of the encapsulant covered by the functional structure;

wherein at least part of the covered surface portion of the encapsulant is spatially selectively roughened.

2. The electronic component according to claim 1, wherein the roughened surface of the encapsulant has a uniform roughness profile.

3. The electronic component according to claim 2, wherein the roughened surface of the encapsulant has a roughness of at least 1 µm, in particular in a range between 1 µm and 10 µm, more particularly in a range between 2 µm and 4 µm.

4. The electronic component according to claim 1, wherein the discontinuity is formed as an annular indentation in the surface portion of the encapsulant covered by the functional structure.

5. The electronic component according to claim 1, wherein the roughened surface of the encapsulant is selectively located only adjacent to, in particular surrounding, at least part of the discontinuity.

6. The electronic component according to claim 1, wherein the roughened surface of the encapsulant has a locally limited higher roughness than another lower roughness at a remaining surface of the encapsulant covered by the functional structure.

7. The electronic component according to claim 1, wherein the functional structure is an electrically insulating and thermally conductive interface structure.

8. The electronic component according to claim 7, wherein the electronic component further comprises a heat dissipation body attached or to be attached to the interface structure for dissipating heat generated by the electronic chip during operation of the electronic component.

9. The electronic component according to claim 1, wherein the electronic chip is configured as at least one of the group consisting of:
   a power semiconductor chip; and
   an electronic chip with vertical current flow.

10. The electronic component according to claim 1, wherein the functional structure is an optically transparent structure.

11. The electronic component according to claim 1, wherein the functional structure is a magnetic structure, in particular a permanent magnetic structure, more particularly a ferromagnetic structure.

12. The electronic component according to claim 1, wherein the functional structure is configured to provide for a mechanical decoupling of a microelectromechanical structure, in particular with a low Young modulus.

13. The electronic component according to claim 1, wherein the encapsulant comprises a first mold compound and the functional structure comprises a second mold compound.

14. A method of manufacturing an electronic component, the method comprising:

mounting an electronic chip on an electrically conductive carrier;

encapsulating at least part of at least one of the carrier and the electronic chip by an encapsulant;

spatially selectively roughening a surface portion of the encapsulant to thereby form a spatially selectively roughened surface, the roughening is carried out during the encapsulating using an encapsulation tool having, in relation to the roughened surface, an inverse roughened surface;

covering at least part of the roughened surface of the encapsulant by a functional structure.

15. The method according to claim 14, wherein the method comprises, after the spatially selective roughening, at least one of the group consisting of plasma treating and cleaning the roughened surface of the encapsulant.

16. The method according to claim 14, wherein the encapsulation tool is a molding tool, and wherein the roughening is carried out during molding the encapsulant in the molding tool.

17. A method of manufacturing a component, the method comprising:

forming an encapsulant, in particular a first mold compound;

covering a surface portion of the encapsulant by a functional structure, in particular a second mold compound;

wherein only a sub-portion of the covered surface portion of the encapsulant is roughened, and wherein the roughening is carried out during the encapsulating using an encapsulation tool, in particular a molding tool, having, in relation to the roughened surface, an inverse roughened surface.

18. An apparatus for manufacturing a component with an encapsulant having a spatially selectively roughened surface, the apparatus comprising:

an encapsulation tool having an accommodation space configured for forming an encapsulant;

wherein the encapsulation tool has an, in relation to the roughened surface of the encapsulant to be formed, inverse roughened surface delimiting part of the accommodation space so that, when a preform of the encapsulant is filled in the accommodation space and is solidified, the encapsulant is formed with the roughened surface in a region corresponding to the inverse roughened surface.

19. The apparatus according to claim 18, wherein the accommodation space is configured for accommodating a chip carrier and an electronic chip mounted on the chip carrier and configured for forming the encapsulant encapsulating at least part of at least one of the chip carrier and the electronic chip.

20. The apparatus according to claim 18, further comprising a functional structure formation tool configured for forming a functional structure covering a surface portion, including the roughened surface, of the formed encapsulant.

* * * * *